United States Patent
Adler et al.

(10) Patent No.: US 6,750,114 B2
(45) Date of Patent: Jun. 15, 2004

(54) ONE-MASK METAL-INSULATOR-METAL CAPACITOR AND METHOD FOR FORMING SAME

(75) Inventors: Eric Adler, Jericho, VT (US); Anthony Kendall Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/179,285

(22) Filed: Jun. 26, 2002

(65) Prior Publication Data

US 2003/0178696 A1 Sep. 25, 2003

Related U.S. Application Data

(62) Division of application No. 10/063,140, filed on Mar. 25, 2002, now Pat. No. 6,452,779.

(51) Int. Cl.⁷ .............................................. H01L 21/20
(52) U.S. Cl. ..................... 438/396; 438/595; 438/957
(58) Field of Search .................................. 438/250, 253, 438/393, 396, 595, 957

(56) References Cited

U.S. PATENT DOCUMENTS

| | | | |
|---|---|---|---|
| 5,173,752 A | 12/1992 | Motonami et al. | 257/309 |
| 5,330,931 A | 7/1994 | Emesh | 438/396 |
| 5,633,781 A | 5/1997 | Saenger et al. | 361/305 |
| 5,925,918 A | 7/1999 | Wu et al. | 438/595 |
| 5,943,580 A | 8/1999 | Ramakrishnan | 438/393 |
| 6,075,274 A | 6/2000 | Wu et al. | 438/595 |
| 6,115,233 A | 9/2000 | Seliskar et al. | 361/303 |
| 6,200,629 B1 | 3/2001 | Sun | 438/253 |
| 6,274,435 B1 * | 8/2001 | Chen | 438/267 |
| 6,344,964 B1 | 2/2002 | Adler | 361/313 |
| 6,430,028 B1 * | 8/2002 | Kar-Roy et al. | 361/306.3 |
| 6,576,526 B2 * | 6/2003 | Kai et al. | 438/393 |
| 6,638,816 B2 * | 10/2003 | Wakabayashi | 438/251 |

FOREIGN PATENT DOCUMENTS

JP 2000-22083 1/2000

* cited by examiner

Primary Examiner—Chandra Chaudhari
(74) Attorney, Agent, or Firm—William D. Sabo, Esq.; McGinn & Gibb, PLLC

(57) ABSTRACT

A capacitor structure formed on an insulation layer includes a lower electrode formed on a surface of the insulation layer, a dielectric layer formed on a surface of the lower electrode, an upper electrode formed on a surface of the dielectric layer, a first spacer formed on a side portion of the upper electrode, and a second spacer formed on a side portion of the first spacer and a side portion of the lower electrode. This capacitor structure is formed by depositing a metal-insulator-metal capacitor stack on top of a via, masking and etching an upper electrode of the metal-insulator-metal capacitor stack, depositing and etching a first spacer on an edge surface of the upper electrode, defining a lower electrode of the metal-insulator-metal capacitor based on the first spacer, depositing and etching a second spacer on a surface of the first spacer and an edge of the lower electrode, and forming a wiring layer on a surface of the upper electrode and a surface of the second spacer. This capacitor structure provides a capacitor that is not prone to leakage down the capacitor sidewall and the corresponding method of manufacture provides a capacitor that is fabricated with increased efficiency (e.g., fewer mask steps).

5 Claims, 4 Drawing Sheets

ONE-MASK METAL-INSULATOR-METAL CAPACITOR AND METHOD FOR FORMING SAME

The present Application is a Divisional Application of U.S. patent application Ser. No. 10/063,140, filed on Mar. 25, 2002 now U.S. Pat. No. 6,452,779.

BACKGROUND OF THE INVENTION

1. Field of the Invention

The present invention generally relates to a metal-insulator-metal (MIM) capacitor having a first spacer protecting an upper electrode and a second spacer protecting a lower electrode, and a method of manufacturing the same.

2. Description of the Related Art

Back of the line capacitors fabricated as part of the wire and via process are a required part of integrated circuit manufacturing. MIM capacitors have been in high volume manufacturing for several years and, for the foundry technologies, will see increasing use in the future. One basic problem with MIM capacitors is that if the sidewalls are vertical, then there is a potential for a leakage path down the capacitor sidewalls, which results in defective capacitors. FIG. 1 provides an example of a MIM capacitor prone to leakage down the capacitor sidewalls and shows a conventional capacitor structure including an upper electrode 102, a dielectric layer 103, and a lower electrode 104, a via 107, a via 140, metal layer 170, a via 172, a via 174, metal layer 176, intermetal dielectric 106 and metal layer 160.

To address this problem, conventional MIM capacitors have been fabricated by first etching an upper electrode using a first mask, and then etching the lower electrode using a second mask. A MIM capacitor created by this method of manufacture is depicted in FIGS. 2 and 3. FIG. 2 is a conventional MIM capacitor that avoids a leakage problem and involves three additional mask layers. This structure includes a capacitor stack including an upper electrode 102, a dielectric 103, and a lower electrode 104. Further, vias 107, 140, 172, and 174 are also provided.

FIG. 3 is a conventional MIM capacitor that avoids a leakage problem and involves two additional mask layers. FIGS. 2 and 3 show similar MIM capacitors, with a primary distinction that bottom plate of the MIM Capacitor depicted in FIG. 2 is contacted from below and therefore requires three additional masks while the MIM Capacitor depicted in FIG. 3 is contacted from above and involves only two additional masks. It is noted that FIG. 3 additionally depicts an insulating diffusion barrier layer 105 configured to prevent diffusion of the metal layer 106.

FIGS. 4(A) and 4(B) depict MIM capacitors in accordance with the present invention. FIGS. 5(A), 5(B), 5(C), 5(D), and 5(E) depicts a method of manufacturing a MIM capacitor in accordance with the present invention. Although this configuration addresses the problem of leakage down the capacitor sidewalls, the additional mask layer leads to an increased cost and complexity associated with the fabrication process.

SUMMARY OF THE INVENTION

In view of the above and other problems of the invention and systems and technologies, it is an object of the invention to provide a MIM capacitor that is not prone to leakage down the capacitor sidewall and a method for manufacturing the MIM capacitor that is inexpensive and efficient (e.g., by reducing the number of mask steps required for fabrication of the capacitor structure).

According to one embodiment of the invention, this object is achieved by a capacitor structure formed on an insulation layer including a lower electrode formed on a surface of the insulation layer, a dielectric layer formed on a surface of the lower electrode, an upper electrode formed on a surface of the dielectric layer, a first spacer formed on a side portion of the upper electrode, and a second spacer formed on a side portion of the first spacer and a side portion of the lower electrode.

This capacitor structure may be formed by depositing a metal-insulator-metal capacitor stack on top of a via, masking and etching an upper electrode of the metal-insulator-metal capacitor stack, depositing and etching a first spacer on an edge surface of the upper electrode, defining a lower electrode of the metal-insulator-metal capacitor based on the first spacer, depositing and etching a second spacer on a surface of the first spacer and an edge of the lower electrode, and forming a wiring layer on a surface of the upper electrode and a surface of the second spacer. This capacitor structure and its corresponding method of manufacture provide a protected capacitor structure that is fabricated with increased efficiency (e.g., fewer mask steps).

BRIEF DESCRIPTION OF THE DRAWINGS

The foregoing and other objects, aspects and advantages will be better understood from the following detailed description of two preferred embodiments of the invention with reference to the drawings, in which.

All of these figures are for the sake of clarity and are not shown in precise dimensions, nor are the relationships between the dimensions drawn to scale.

DETAILED DESCRIPTION OF THE PREFERRED EMBODIMENTS OF THE INVENTION

Figure 1:
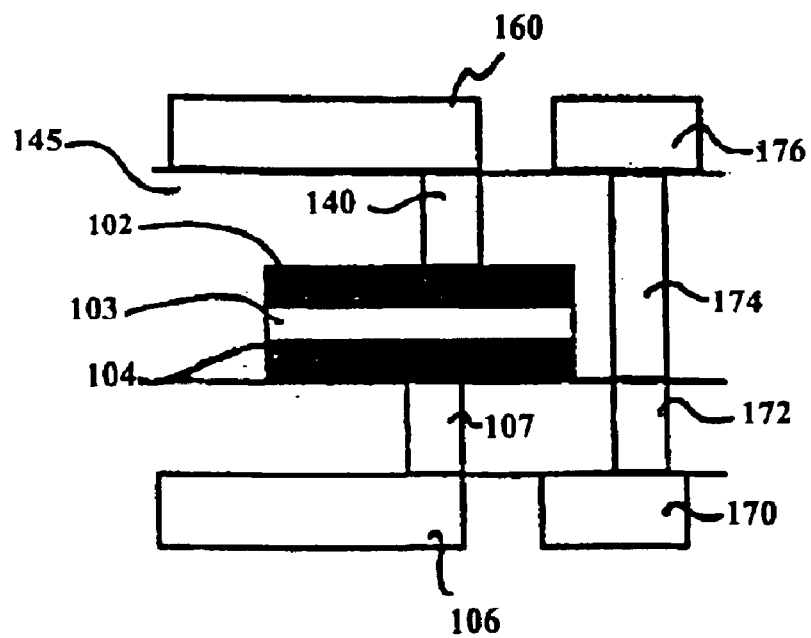
FIG. 1 is a conventional MIM capacitor that is prone to leakage down the capacitor sidewall.
Figure 2:
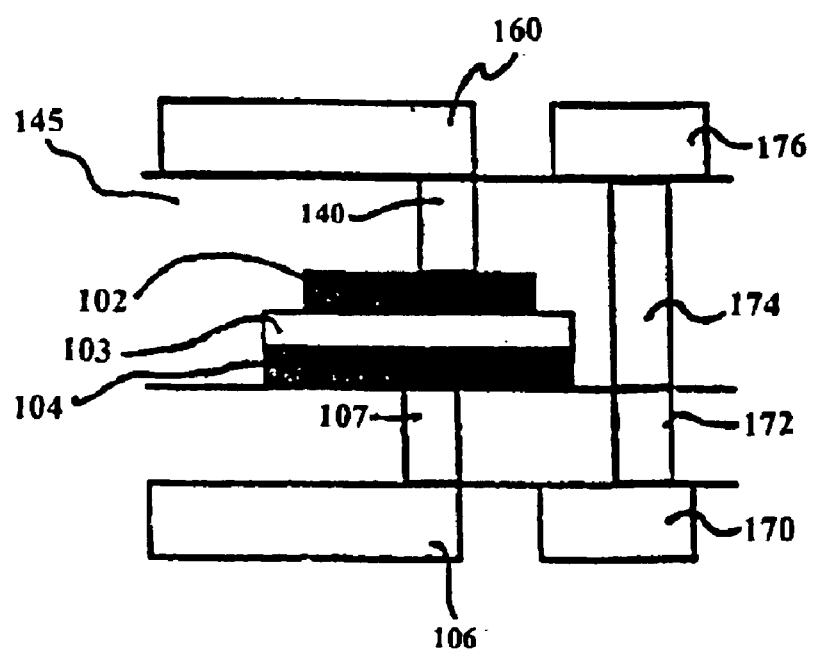
FIG. 2 is a conventional MIM capacitor that avoids a leakage problem and involves three additional mask layers.
Figure 3:
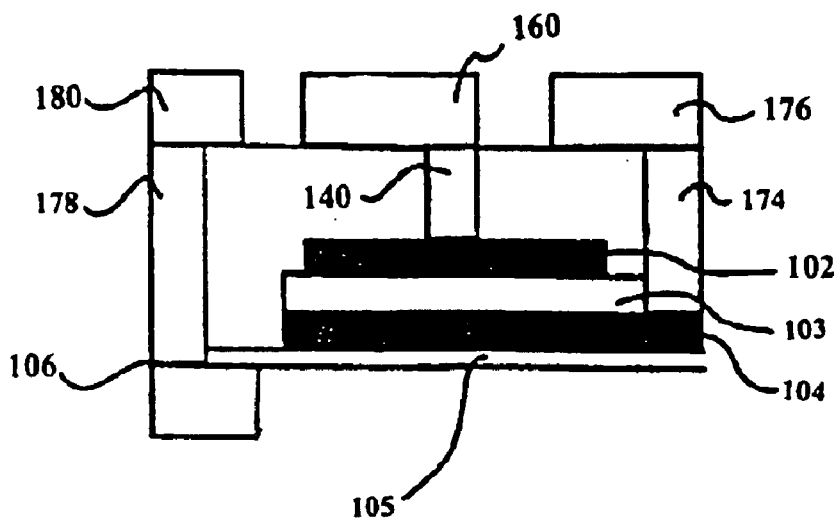
FIG. 3 is a conventional MIM capacitor that avoids a leakage problem and involves two additional mask layers.
Figure 4A:
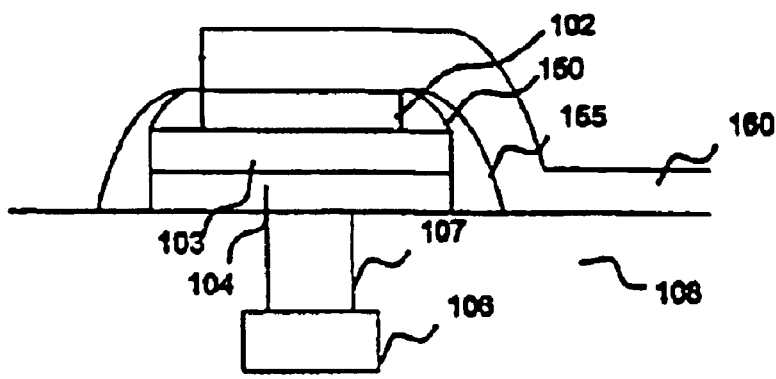
FIGS. 4(A) and 4(B) depict MIM capacitors in accordance with the present invention.

Referring now to the drawings, FIG. 4(A) depicts a MIM capacitor 400 in accordance with the present invention. MIM capacitor 400 includes an insulation layer 108, a capacitor stack 102, 103, 104, a via 107, and a metal layer 106. In a preferred embodiment, via 107 may be formed of any suitable via material including tungsten and metal layer 106 may comprise any suitable conductive material including copper.

The capacitor stack includes a lower electrode 104 formed on a surface of the insulation layer 108, a dielectric layer 103 formed on a surface of the lower electrode 104, and an upper electrode 102 formed on a surface of the dielectric layer 103. The upper electrode 102 and lower electrode 104 may be formed on any suitable conductive material, including tungsten.

Figure 4B:
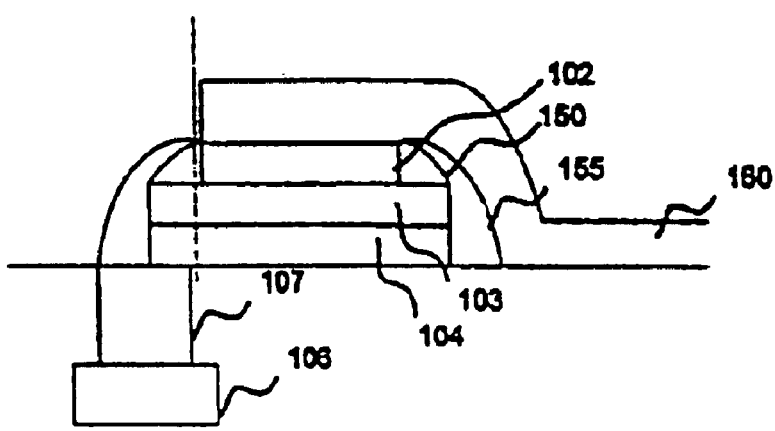

MIM capacitor 400 additionally includes a first spacer 150 and a second spacer 155. The first spacer 150 is formed on a side portion of the upper electrode 102. In a preferred embodiment, the first spacer provides a complete seal over the edges (e.g., sidewalls) of the upper electrode 102, as depicted in FIGS. 4(A) and 4(B). The spacers may be configured based on the needs of the MIM capacitor, and in one embodiment they have a width of approximately 200 nm.

These spacers may be formed by the usual method of deposition and directional etching of a suitable insulator, such as those methods described in U.S. patent application Ser. No. 09/616,951, Docket No. BUR91999022US1 filed on Jul. 14, 2001, by Eric Alder entitled "Capacitor Having a Sidewall Spacer and Method of Fabricating the Same," assigned to International Business Machines Corporation.

The second spacer 155 is formed on a side portion of the first spacer 150, a side portion of the dielectric layer 103, and a side portion of the lower electrode 104. In a preferred embodiment, the second spacer provides a complete seal over the edges the first spacer 150, the dielectric layer 103, and the lower electrode 104, as depicted in FIGS. 4(A) and 4(B).

A wiring layer 160 may then be formed directly over a top surface of the upper electrode 102. The wiring layer is additionally formed along an edge of the second spacer 155 and on a surface of the insulation layer 108. This configuration of the second spacer 155, in addition to the first spacer 150, enables a wiring layer 160 to be applied directly over the capacitor structure without the use of an additional mask step.

In an alternative embodiment, the upper electrode 102 may be formed outside an edge portion of the via 107 while an outer edge of the lower electrode 104 is formed over the via 107, as depicted in FIG. 4(B). In other words, in the alternative embodiment, there exists no line perpendicular to a top surface of the insulation layer 108 that intersects both the via 107 and the upper electrode 102.

By shifting the upper electrode 102 of the capacitor with respect to the via 107 such that there is no overlap between the upper electrode 202 and the bottom via 107, the topography of the present capacitor structure 400 may be reduced. Specifically, by shifting the via 107 as depicted in FIG. 4(B), the potential for lower electrode 104 degrading the dielectric properties of the dielectric layer 103 is reduced.

Figure 5A:
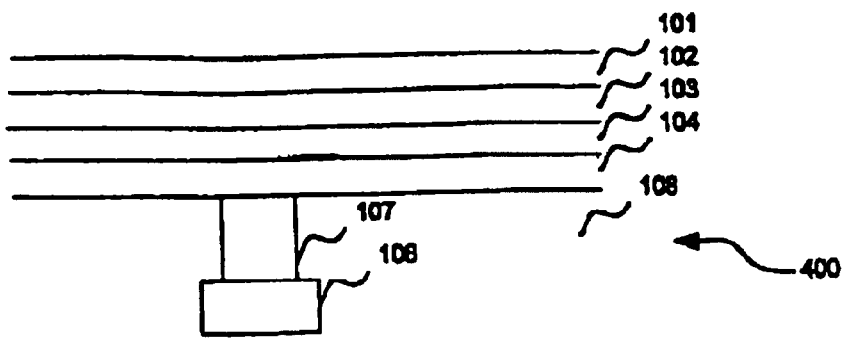
FIG. 5 depicts a method of manufacturing a MIM capacitor in accordance with the present invention.

FIGS. 5(A)–5(E) depict a method of manufacturing a MIM capacitor in accordance with the present invention. The method involves an insulation layer 108 having an exposed via 107. The method begins with forming a capacitor stack 102, 103, 104 on the insulation layer 108, as depicted in FIG. 5(A). A mandrel layer 101, formed of an insulator, is deposited over the top electrode. The purpose of the mandrel layer 101 is to ensure proper formation of the two sidewall spacers layers 150 and 155 during the process.

Figure 5B:
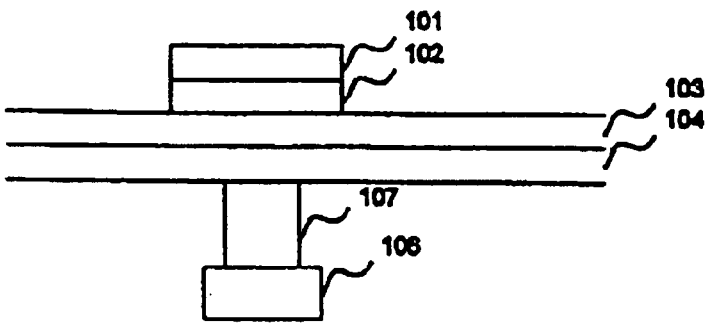

Next, the upper electrode 102 and the mandrel layer 101 are masked and etched, as depicted in FIG. 5(B), the etch coming to a stop at the capacitor dielectric layer 103. By stopping the etch at the dielectric layer 103, formation of a leakage path between the 2 electrodes is prevented. This is the only masking operation performed on the MIM capacitor 400.

Figure 5C:
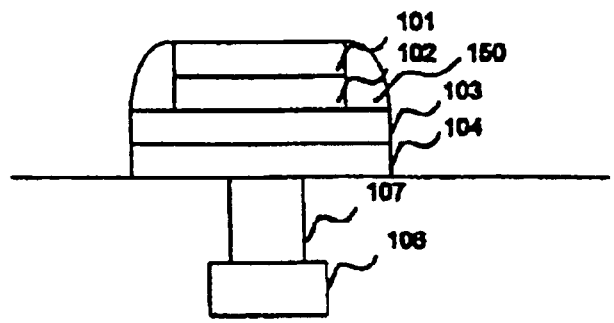

After completing the masking and etching, a first spacer 150 is deposited and etched on an edge surface of the upper electrode 102 and the mandrel layer 101. After depositing and etching the first spacer 150, the lower electrode layer 104 and the dielectric layer 103 are defined by using the outer edge of the first spacer 150 to determine the width of the lower electrode layer 104 and the dielectric layer 103. The resulting cross section is shown in FIG. 5(C). The sealing of the top electrode layer 102 by the combination of the mandrel layer 101 and the first spacer layer 150, prevents the formation of a leakage path between the top and bottom electrodes during the etch.

Figure 5D:
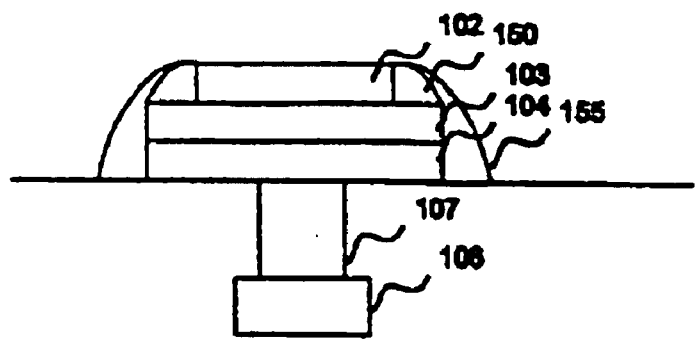

After defining the lower electrode layer 104 and the dielectric layer 103, the second spacer 155 is formed, for example, by insulator deposition and directional etch processes. The directional etch process also causes the removal of the mandrel layer 101. The resulting structure is shown in FIG. 5(D) In a preferred embodiment, the second spacer is deposited on a surface of the first spacer 150 and an edge of the lower electrode 104 and the dielectric layer 103.

Figure 5E:
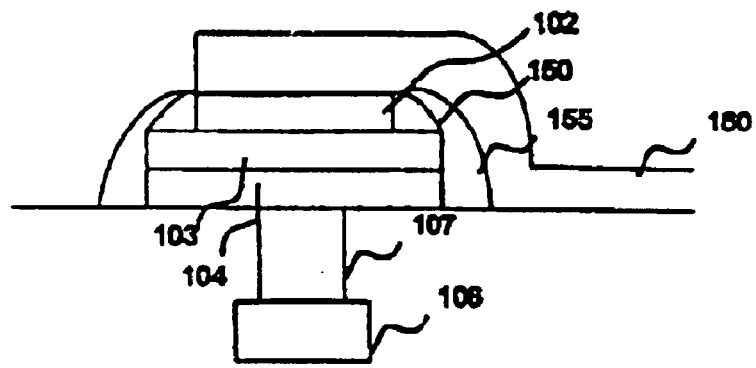

Once the second spacer has been formed, the wiring layer 160 is formed on the upper electrode 102 and a surface of the second spacer 155 as is shown in FIG. 5E. Additionally, as depicted in FIGS. 4(A) and 4(B), the wiring layer 160 may be formed on a surface of the insulation layer 108. Wiring layer 160 may be formed of any suitable material, and in a preferred embodiment wiring layer 160 comprises aluminum.

While the invention has been described in terms of two preferred embodiments, those skilled in the art will recognize that the invention may be practiced with modification within the spirit and scope of the appended claims.

For example, while the invention has been described exemplarily with regard to a copper metal layer 106 and an aluminum wiring layer 160, other materials currently existing or later developed having suitable characteristics may be used instead. Additionally, other materials presently used or later developed may be substituted for each of the elements described above, as is known in the art.

What is claimed is:

1. A method of forming a metal-insulator-metal capacitor structure over an insulative layer having an exposed via the method comprising:

depositing a metal-insulator-metal capacitor stack on top of the via;

masking and etching an upper electrode of the metal-insulator-metal capacitor stack;

depositing and etching a first spacer on an edge surface of the upper electrode;

defining a lower electrode of the metal-insulator-metal capacitor based on the first spacer; and depositing and etching a second spacer on a surface of the first spacer and an edge of the lower electrode.

2. The method of forming a metal-insulator-metal capacitor structure of claim 1, further comprising:

forming a wiring layer on a surface of the upper electrode and a surface of the second spacer.

3. The method of forming a metal-insulator-metal capacitor structure of claim 1, wherein the upper electrode is formed outside an edge portion of the via.

4. The method of forming a metal-insulator-metal capacitor structure of claim 1, wherein the first and second spacers comprise an insulative material.

5. The method of forming a metal-insulator-metal capacitor structure of claim 1, wherein the upper electrode and the lower electrode comprise titanium nitride.

* * * * *